(12) United States Patent
Choi et al.

(10) Patent No.: US 7,743,312 B2
(45) Date of Patent: Jun. 22, 2010

(54) METHOD FOR PUNCTURING LOW DENSITY PARITY CHECK CODE

(75) Inventors: Eoi-Young Choi, Seoul (KR); Seung-Bum Suh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1120 days.

(21) Appl. No.: 11/367,521

(22) Filed: Mar. 3, 2006

(65) Prior Publication Data

US 2006/0206781 A1 Sep. 14, 2006

(30) Foreign Application Priority Data

Mar. 4, 2005 (KR) .................. 10-2005-0018376

(51) Int. Cl.
*H03M 13/03* (2006.01)

(52) U.S. Cl. ...................... 714/790; 714/758

(58) Field of Classification Search .............. 714/752, 714/786, 790
See application file for complete search history.

(56) References Cited

U.S. PATENT DOCUMENTS

| | | | | |
|---|---|---|---|---|
| 6,961,888 B2 * | 11/2005 | Jin et al. | .................... | 714/752 |
| 7,000,174 B2 * | 2/2006 | Mantha et al. | ............... | 714/790 |
| 7,139,964 B2 * | 11/2006 | Shen et al. | .................. | 714/758 |
| 7,222,284 B2 * | 5/2007 | Stolpman | .................... | 714/774 |

FOREIGN PATENT DOCUMENTS

EP 1 589 663 10/2005

OTHER PUBLICATIONS

Jeongseok Ha et al., Puncturing for Finite Length Low-Density Parity-Check Codes, 2004 IEEE.
Victor Stolpman et al., Irregular Structured LDPC Codes, Aug. 17, 2004.
Eoiyoung Choi et al., Rate Compatible Puncturing for Low-Density Parity-Check Codes With Dual-Diagonal Parity Structure, 2005 IEEE.
Thomas J. Richardson et al., Efficient Encoding of Low-Density Parity-Check Codes, IEEE Transactions on Information Theory, vol. 47, No. 2, Feb. 2001.
Hossein Pishro-Nik et al. "Results on Punctured LDPC Codes." IEEE Information Theory Workshop, 2004. pp. 215-219.

* cited by examiner

*Primary Examiner*—Esaw T Abraham
(74) *Attorney, Agent, or Firm*—NSIP Law

(57) ABSTRACT

A method is provided for puncturing a low density parity check (LDPC) code decoded by a parity check matrix that is expressed by a factor graph including a check node and a bit node, being connected to each other at an edge, and includes a parity part having a dual diagonal matrix with a single 3-weight column and the remaining columns being 2-weight columns. The method includes generating a puncturing pattern such that bits of the LDPC code are punctured in an order of a bit mapped to a column with a higher weight from among the columns constituting the parity part; and puncturing the LDPC code according to the generated puncturing pattern.

10 Claims, 9 Drawing Sheets

$$H = \begin{bmatrix} P_{0,0} & P_{0,1} & \cdots & P_{0,n_b-1} \\ P_{1,0} & P_{1,1} & \cdots & P_{1,n_b-1} \\ \vdots & \vdots & \vdots & \vdots \\ P_{m_b-1,0} & P_{m_b-1,1} & \cdots & P_{m_b-1,n_b-1} \end{bmatrix}$$

FIG.1

$$H_{b2} = \begin{bmatrix} h_b(0) & 1 & & & 0 \\ h_b(1) & 1 & 1 & & \\ h_b(2) & & 1 & \ddots & \\ \vdots & & & \ddots & 1 \\ & & & & 1 & 1 \\ h_b(m_b-1) & 0 & & & & 1 \end{bmatrix}$$

FIG.2

METHOD FOR PUNCTURING LOW DENSITY PARITY CHECK CODE

PRIORITY

This application claims the benefit under 35 U.S.C. §119 (a) of an application entitled "Method for Puncturing Low Density Parity Check Code" filed in the Korean Intellectual Property Office on Mar. 4, 2005 and assigned Serial No. 2005-18376, the entire contents of which are incorporated herein by reference.

BACKGROUND OF THE INVENTION

1. Field of the Invention

The present invention relates generally to a Low Density Parity Check (LDPC) code, and in particular, to a method for puncturing an LDPC code.

2. Description of the Related Art

An LDPC code is now attracting much attention as a coding scheme suitable for the $4^{th}$ generation (4G) mobile communication system because it has higher performance and lower decoding complexity and enables faster parallel processing, compared with a turbo code.

The LDPC code, which was first proposed by Gallager in 1962, is a linear block code in which most of the elements of its parity check matrix H are '0'. The LDPC code has not been commercially utilized due to the coding complexity problem, which could not be solved with the technology of that time. However, Mackay and Neal have recently revived the LDPC code, and have proven the high performance of the LDPC code using Gallager's simple probabilistic decoding algorithm.

The LDPC code is defined by a parity check matrix H in which, there are only a few number of elements of '1'. The parity check matrix H is a matrix used for determining whether a received signal was normally decoded, and when the product of a coded received signal and the parity check matrix H becomes '0', this signifies that no error has occurred. Therefore, the LDPC code first designs a predetermined parity check matrix such that a value determined by multiplying it by every coded received signal can become '0', and then inversely performs the coding operation carried out by an encoder of a transmitter based on the designed parity check matrix.

The parity check matrix H is randomly generated such that an overlap between two random columns is not greater than 1. The term "weight" as used herein refers to the number of non-zero elements, i.e., elements of '1', and the phrase "overlap between two columns" refers to the inner product between rows. Therefore, the weights of rows and columns are much less than the code length. For these reasons, a code generated by the parity check matrix H is called a Low Density Parity Check (LDPC) code.

Techniques capable of generating LDPC codes with various coding rates are roughly divided into two methods. A first method, a technique for calculating a code itself, designs an LDPC code such that one large parity check matrix can include therein parity check matrixes having various coding rates. This technique, in making one large parity check matrix, generates parity check matrixes matched to each coding rate included in the large matrix according to their conditions. An LDPC code generated by this technique can estimate its performance for each coding rate and obtain a high performance. However, this technique has difficulty in obtaining various coding rates, and cannot be applied to a Full Incremental Redundancy (Full IR) or a Partial IR for a Hybrid Automatic Repeat reQuest (H-ARQ) system that requires combining technologies between coded bits due to the mismatch between coded bit streams at each coding rate.

A second method, a technique for performing puncturing according to a coding rate after a coding process, allows a transmitter to perform puncturing according to a predetermined pattern and then allows a decoder of a receiver to substitute a log likelihood ratio (LLR) value of '0' or a probability value of '0.5' in a punctured bit node, thereby enabling decoding. The puncturing technique can easily generate a desired coding rate, and can be applied to the H-ARQ technology like the conventional Rate Compatible Punctured Turbo (RCPT), without causing an additional increase in the complexity of the coding process. However, the LDPC code generated by this technique is lower in performance than the LDPC code having the optimal parity check matrix at each coding rate, i.e., the LDPC code generated by the first technique. In order to compensate for performance degradation due to the puncturing of the LDPC code, research is being conducted on various puncturing techniques. However, even the puncturing techniques proposed up to now have room for performance improvement when the limited channel capacity is taken into consideration.

SUMMARY OF THE INVENTION

It is, therefore, an object of the present invention to provide a puncturing method for preventing performance degradation during the puncturing of an LDPC code, caused by a low density parity check matrix having an almost zigzag parity pattern.

According to one aspect of the present invention, there is provided a method for puncturing a low density parity check (LDPC) code decoded by a parity check matrix that is expressed by a factor graph including a check node and a bit node, having a common edge, and includes a parity part having a dual diagonal matrix with a single 3-weight column and the remaining columns being 2-weight columns. The method includes generating a puncturing pattern such that bits of the LDPC code are punctured in the order of a bit mapped to a column with a higher weight among the columns constituting the parity part; and puncturing the LDPC code according to the generated puncturing pattern.

According to another aspect of the present invention, there is provided a method for puncturing a low density parity check (LDPC) code decoded by a parity check matrix that is expressed by a factor graph including a check node and a bit node, having a common edge, and includes a parity part having a dual diagonal matrix with a single 3-weight column and the remaining columns being 2 weight columns. The method comprises the steps of: puncturing a bit node of the LDPC code, being mapped to a column with the highest weight among the columns constituting the parity part; after puncturing the bit node mapped to the column with the highest weight, determining at least one bit node that can be recovered in the next iterative decoding process, using the factor graph; and puncturing the LDPC code in order of a bit node with the highest priority among the determined recoverable bit nodes

BRIEF DESCRIPTION OF THE DRAWINGS

The above and other objects, features and advantages of the present invention will become more apparent from the following detailed description when taken in conjunction with the accompanying drawings in which:

FIG. 1 is a diagram of a structure of a parity check matrix of an LDPC code proposed for an OFDMA PHY layer of the current Institute of Electrical and Electronic Engineers (IEEE) 802.16a system;

FIG. 2 is a diagram illustrating a structure of the parity pattern $H_{b2}$ of the parity check matrix shown in FIG. 1;

DETAILED DESCRIPTION OF EXEMPLARY EMBODIMENTS

A method for puncturing an LDPC code according to a preferred embodiment of the present invention will now be described with reference to accompanying drawings.

FIG. 1 is a diagram of a structure of a parity check matrix of an LDPC code proposed for an Orthogonal Frequency Division Multiple Access (OFDMA) physical (PHY) layer of the current IEEE 802.16a system. In FIG. 1, $P_{i,j}$ denotes a z×z permutation matrix or a z×z zero matrix. A matrix H is extended from an $m_b \times n_b$ binary base matrix $H_b$, where $n=z \cdot n_b$ and $m=z \cdot m_b$, for $z \geq 1$. The base matrix is extended by replacing each element having a value '1' with a z×z permutation matrix and replacing each element having a value '0' with a z×z zero matrix.

The base matrix is divided into two patterns of $H_{b1}$ mapped to systematic bits and $H_{b2}$ mapped to parity check bits, and is expressed as $H_b = [(H_{b1})_{m_b \times k_b} : (H_{b2})_{m_b \times m_b}]$. $H_{b2}$ is divided again into a vector $h_b$ having a weight of 3 and $H'_{b2}$ having a dual-diagonal structure, and is expressed as $H_{b2} = [h_b : H'_{b2}]$.

FIG. 2 is a diagram illustrating a structure of the parity pattern $H_{b2}$ of the parity check matrix shown in FIG. 1. The other elements except for the dual diagonal elements in $H_{b2}$ are all '0'.

In $H'_{b2}$, $h_b(j)$ is equal to 1 for j=0, k, $m_b$−1, otherwise, $h_b(j)$ is equal to 0 (0≤j<$m_b$−1, j≠k).

Figure 3:
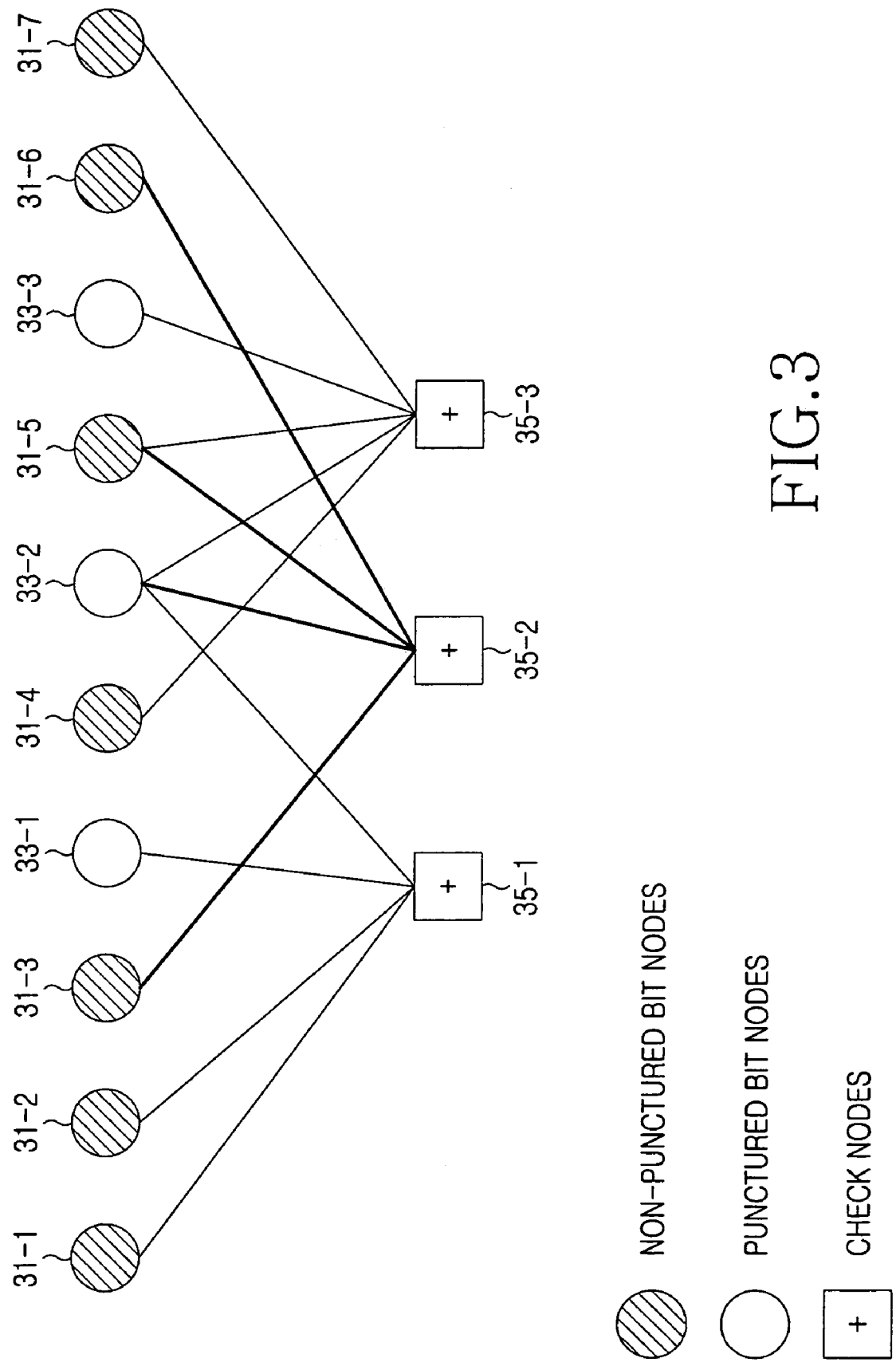
FIG. 3 is an exemplary diagram illustrating a factor graph for a description of the terms defined in a puncturing method according to the present invention.

FIG. 3 is an exemplary diagram illustrating a factor graph for a description of the terms defined in a puncturing method according to the present invention.

In FIG. 3, non-punctured bit nodes 31-1 through 31-7 are called 0-step recoverable (0-SR) nodes, and when at least one survived check node (SC node) among adjacent check nodes 35-1 through 35-3 (connected to each other at the edges) is a check node 35-2 connected only to the 0-SR bit nodes 31-1 through 31-7 except for a punctured bit node 33-2, the punctured bit node 33-2 is called a 1-SR node. Under the assumption of a binary erasure channel (BEC), the 1-SR node is a node that can be recovered through one iterative decoding process (or one iteration) during iterative decoding.

Therefore, if recoverable nodes for each individual step are generalized, a k-SR node refers to a node connected to at least one (k−1)-SR node and at least one SC node connected to m-SR nodes (0≤m≤k−1).

Figure 4:
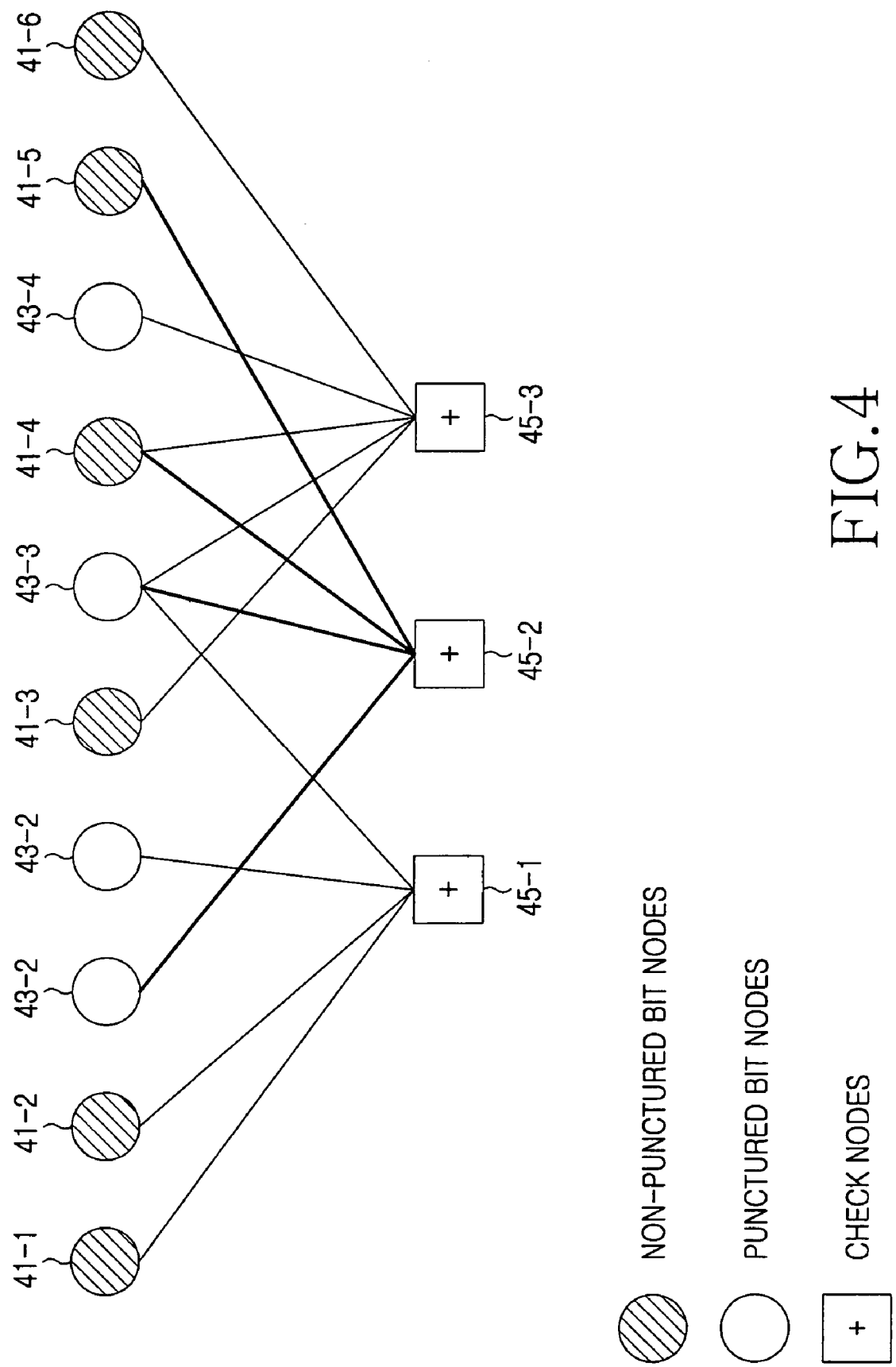
FIG. 4 is a diagram illustrating a factor graph for a description of a k-SR node.

FIG. 4 is an exemplary diagram for a description of a k-SR node. Bit nodes 41-1 through 41-6 are 0-SR nodes or bit nodes recovered up to a (k−1)$^{th}$ step, and a punctured bit node 43-3 connected to at least one (k−1)-SR node 43-2 among check nodes 45-1 through 45-3 and an SC node 45-2 connected to m-SR nodes 41-4 and 41-5 is a k-SR node. Under the assumption of the BEC, the k-SR node refers to a node that can be recovered through k iterative decoding processes (or k iterations) during iterative decoding.

Figure 5:
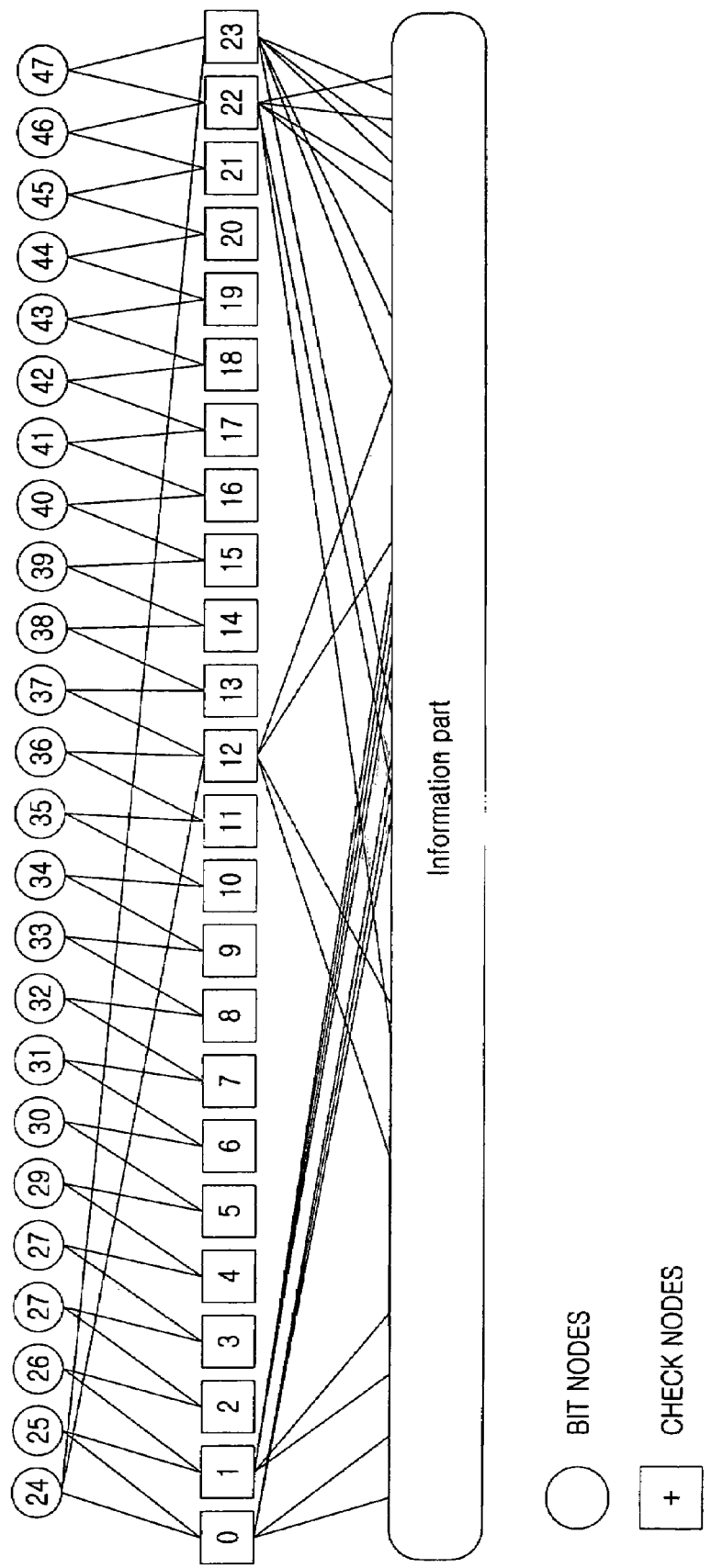
FIG. 5 is a diagram expressing the pattern $H_{b2}$ of FIG. 2 with a factor graph.

FIG. 5 is a diagram expressing the pattern $H_{b2}$ of FIG. 2 with a factor graph. It can be noted that the bit nodes are connected to the check nodes in the almost zigzag form in the factor graph. In particular, it is noted that a first column constituting a first parity pattern is connected to 3 check nodes.

Figure 6:
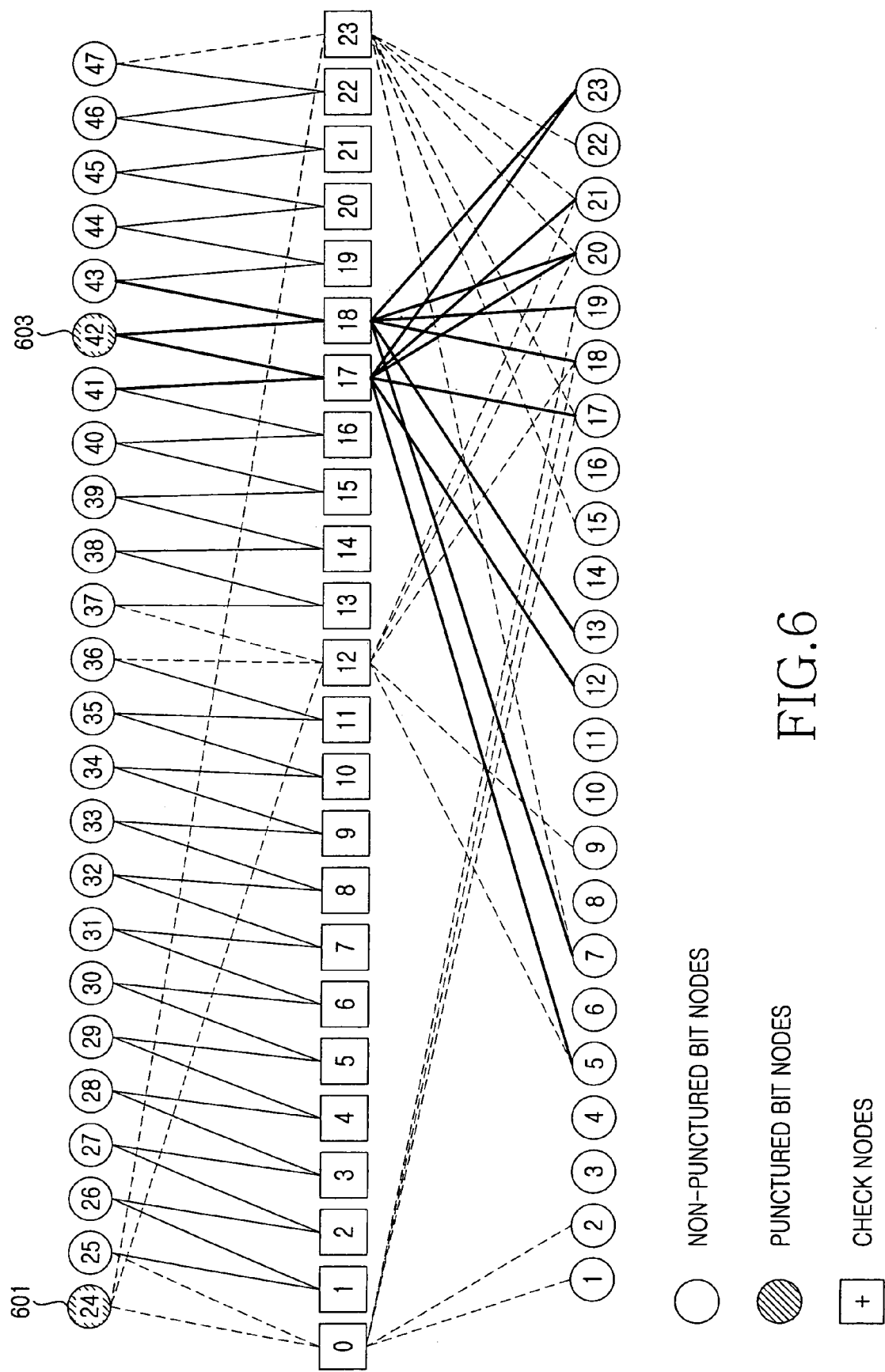
FIGS. 6 and 7 illustrate factor graphs for a description of a method for designing a puncturing pattern using a parity check matrix H of an LDPC code.
Figure 7:
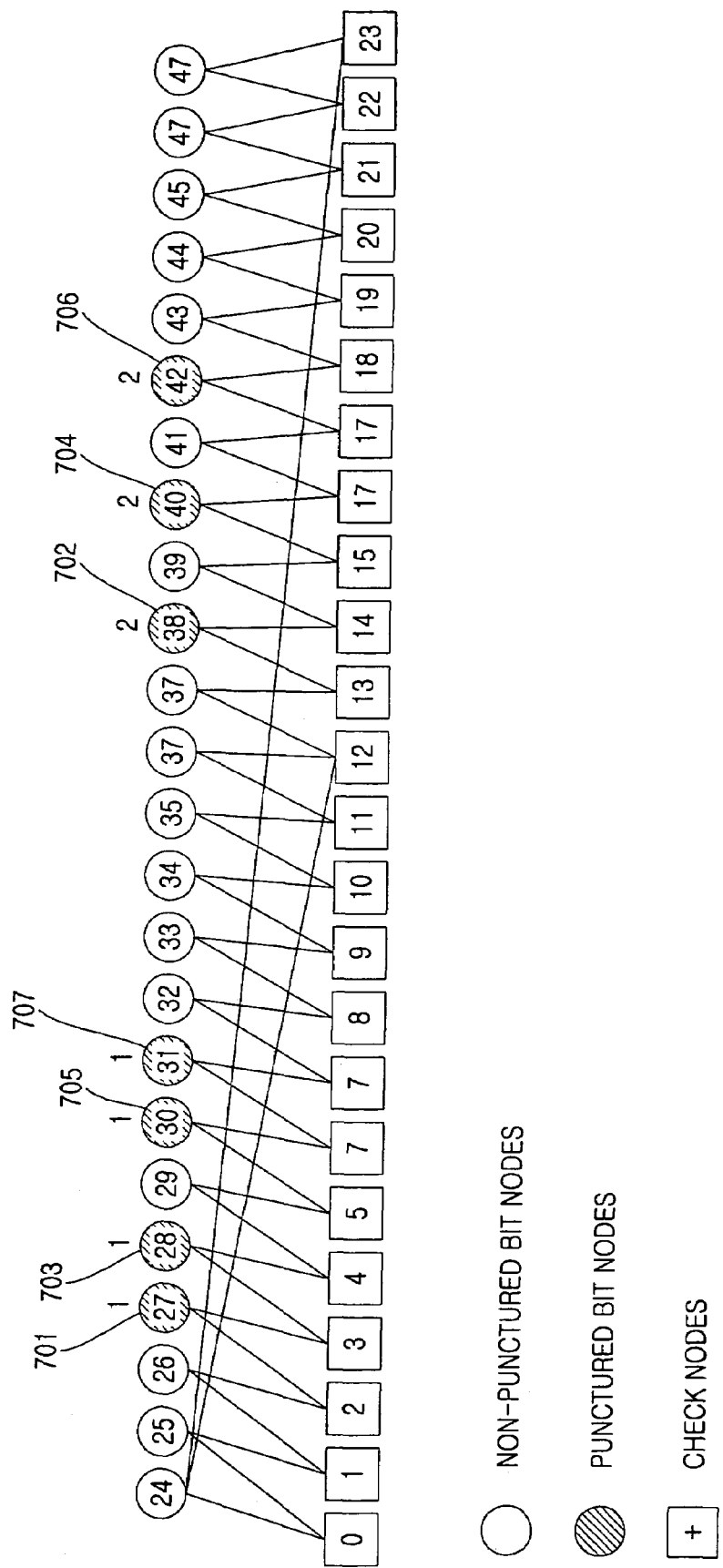

FIGS. 6 and 7 illustrate factor graphs for a description of a method for designing a puncturing pattern using a parity check matrix H of an LDPC code.

As illustrated in FIG. 6, a puncturing pattern design method according to of the present invention punctures a bit node 601 with the highest column weight from a parity part. A bit node with a high column weight receives a great amount of low-reliability information at a low signal-to-noise ratio (SNR), but obtains a great amount of high-reliability information at a high SNR. On the other hand, a bit node 603 with a lower column weight is less affected by low-reliability information at a low SNR, but can only receive limited amounts of high-reliability information at a high SNR.

The puncturing pattern design method according to an embodiment of the present invention maximizes the number of SC nodes connected to each of 1-SR nodes 701 through 707 when defining a 1-SR node set. In FIG. 7, some of the bit nodes 701, 703, 705 and 707 among the 1-SR nodes 701 through 707 have one SR node, and the other bit nodes 702, 704 and 706 have 2 SR nodes. By maximizing the number of the SC nodes for the 1-SR nodes in this way, it is possible to recover 1-SR nodes having one SC node through one iterative decoding (one iteration) in a BEC environment, but it is difficult to recover even one 1-SR node having one SC node through only one iterative decoding in an additive white Gaussian noise (AWGN) environment or actual channel environment. An embodiment of the present invention designs a puncturing pattern, considering an SC node for a 1-SR node as the quality of a 1-SR node. In the almost zigzag parity pattern, the nodes are connected to each other in an almost zigzag pattern and all columns except for the first column are 2 in column weight, making it easy to adjust distribution of the number of SC nodes.

Figure 8:
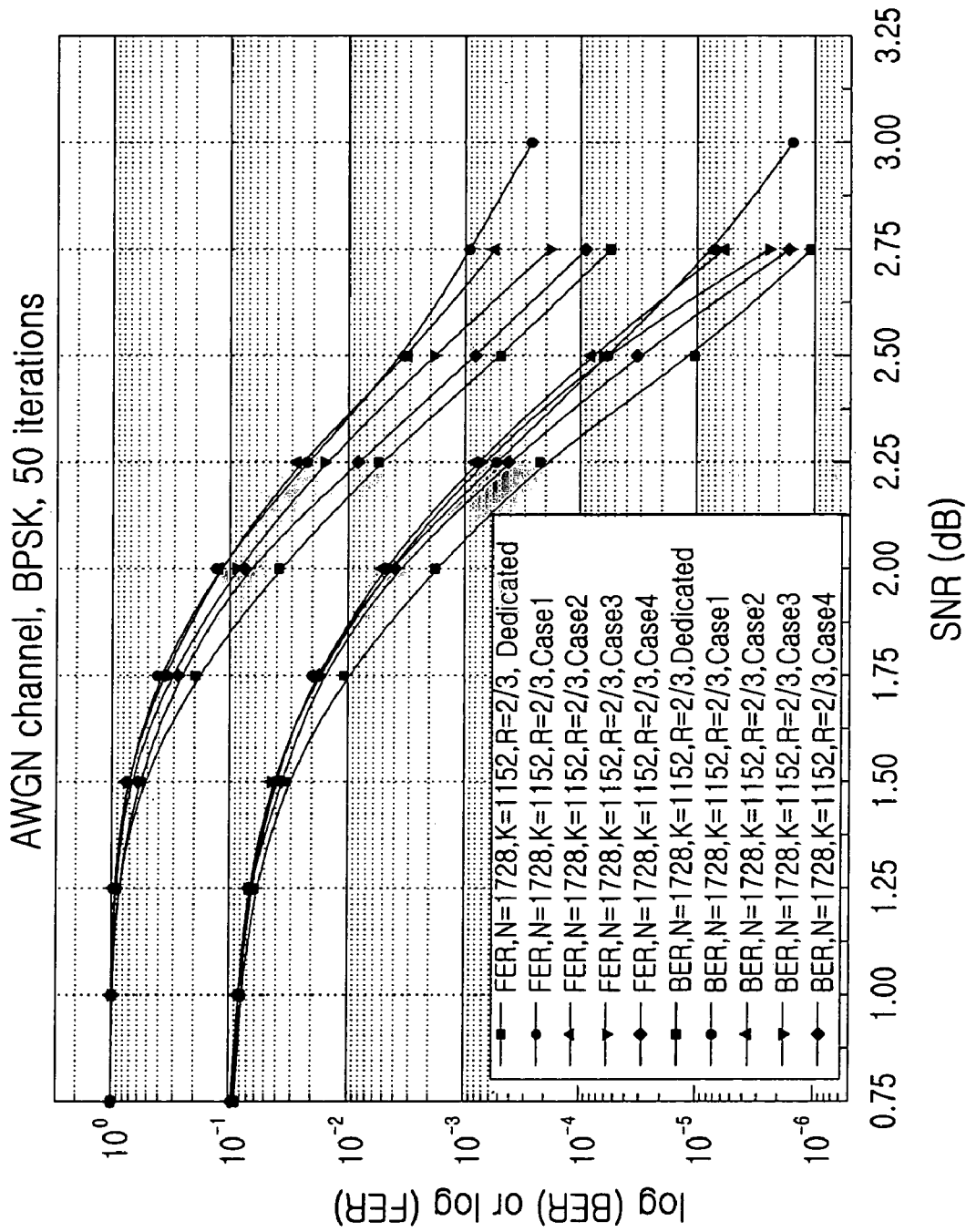
FIG. 8 is a graph illustrating a performance comparison between a novel puncturing pattern and the conventional puncturing pattern when a Quasi-Cyclic (QC) LDPC mother code with N=2304, K=1728 and R=1/2 is subject to 576-bit (12-block) puncturing, providing a coding rate 2/3.

FIG. 8 is a graph illustrating a comparison in performance simulation result between a puncturing pattern designed by the puncturing pattern design method according to the present invention and the conventional puncturing pattern, when a Quasi-Cyclic (QC) LDPC mother code with N=2304, K=1728 and R=1/2 is subject to 576-bit (12-block) puncturing, providing a coding rate 2/3.

Table 1 sets forth the characteristics of the conventional puncturing patterns for an LDPC code, and Table 4 illustrates characteristics of the puncturing patterns generated according to the present invention.

TABLE 1

| | Block index | | | | | | | | | | | |
|---|---|---|---|---|---|---|---|---|---|---|---|---|
| | 25 | 26 | 28 | 29 | 31 | 32 | 34 | 35 | 37 | 38 | 40 | 41 |
| No. of SC nodes | 1 | 1 | 1 | 1 | 1 | 1 | 1 | 1 | 1 | 1 | 1 | 1 |
| Column weight (Wc) | 2 | 2 | 2 | 2 | 2 | 2 | 2 | 2 | 2 | 2 | 2 | 2 |

TABLE 2

| | Block index | | | | | | | | | | | |
|---|---|---|---|---|---|---|---|---|---|---|---|---|
| | 24 | 25 | 27 | 28 | 30 | 31 | 33 | 34 | 36 | 37 | 39 | 40 |
| No. of SC nodes | 1 | 1 | 1 | 1 | 1 | 1 | 1 | 1 | 1 | 1 | 1 | 1 |
| Column weight (Wc) | 3 | 2 | 2 | 2 | 2 | 2 | 2 | 2 | 2 | 2 | 2 | 2 |

TABLE 3

| | Block index | | | | | | | | | | | |
|---|---|---|---|---|---|---|---|---|---|---|---|---|
| | 24 | 25 | 27 | 29 | 31 | 32 | 34 | 36 | 38 | 40 | 42 | 43 |
| No. of SC nodes | 1 | 1 | 2 | 2 | 1 | 1 | 2 | 1 | 2 | 2 | 1 | 1 |
| Column weight (Wc) | 3 | 2 | 2 | 2 | 2 | 2 | 2 | 2 | 2 | 2 | 2 | 2 |

TABLE 4

| | Block index | | | | | | | | | | | |
|---|---|---|---|---|---|---|---|---|---|---|---|---|
| | 24 | 26 | 28 | 30 | 32 | 34 | 36 | 38 | 40 | 42 | 44 | 46 |
| No. of SC nodes | 2 | 2 | 2 | 2 | 2 | 2 | 1 | 2 | 2 | 2 | 2 | 2 |
| Column weight (Wc) | 3 | 2 | 2 | 2 | 2 | 2 | 2 | 2 | 2 | 2 | 2 | 2 |

Table 1 shows puncturing patterns generated by the conventional method of maximizing the number of k-SR nodes, and the patterns do not include a column with the highest weight in a 1-SR node set. A 1-SR node set of Table 1 and a 1-SR node set of Table 2 have the same number of survived check nodes, but the puncturing pattern of Table 2 includes therein only the column with the highest weight as a 1-SR node. It can be noted from the simulation result of FIG. 8 that the performance difference is given by only the presence/absence of only the column with the highest weight. If only the column with the highest weight is not included, an error floor occurs earlier. Table 2 through Table 4 all have only the column with the highest weight as a 1-SR node, but differ in the number of survived check nodes. It can be noted from FIG. 8 that an increase in the number of survived check nodes increases the performance. It can also be noted from FIG. 8 that compared with the use of the convention puncturing pattern, the use of the puncturing pattern according to the present invention exhibits a higher performance over almost the full bit error rate (BER) and frame error rate (FER) ranges for the puncturing patterns of Table 1 through Table 4. In particular, compared with the use of the optimal LDPC code, the use of the puncturing pattern according to the present invention shows a performance loss of 0.08 dB at both a BER of $10^{-4}$ and a BER of $10^{-5}$, and shows performance losses of 0.06 and 0.05 at an FER of $10^{-2}$ and an FER of $10^{-3}$, respectively, exhibiting higher performance compared with the use of the conventional puncturing pattern.

Figure 9:
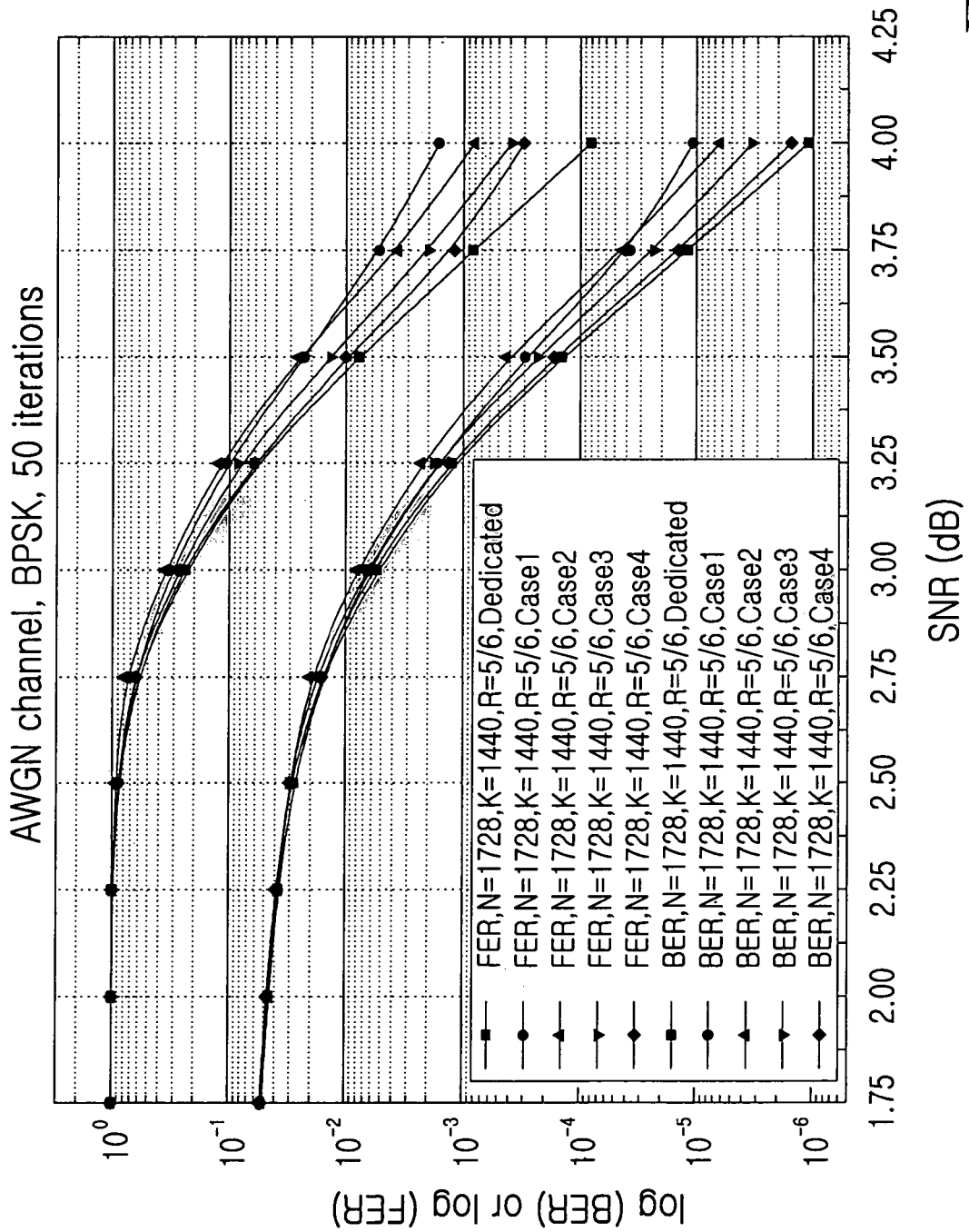
FIG. 9 is a graph illustrating a performance comparison between a novel puncturing pattern and the conventional puncturing pattern when a Block LDPC (BLDPC) mother code with N=1920, K=1440 and R=3/4 is subject to 192-bit (4.8-block) puncturing, providing a coding rate 5/6.

FIG. 9 is a graph illustrating a comparison in performance between the novel puncturing pattern and the conventional puncturing pattern when a Block LDPC (BLDPC) mother code with N=1920, K=1440 and R=3/4 is subject to 192-bit (4.8-block) puncturing, providing a coding rate 5/6. The graph of FIG. 9 shows the similar simulation result to that of the graph shown in FIG. 8. In particular, the use of the novel puncturing pattern exhibits performance losses of 0.01 dB and 0.02 dB at a BER of $10^{-4}$ and a BER of $10^{-5}$, respectively, and exhibits performance losses of 0.02 and 0.07 at an FER of $10^{-2}$ and an FER of $10^{-3}$, respectively, exhibiting higher performance compared with the use of the conventional puncturing pattern.

Figure 10:
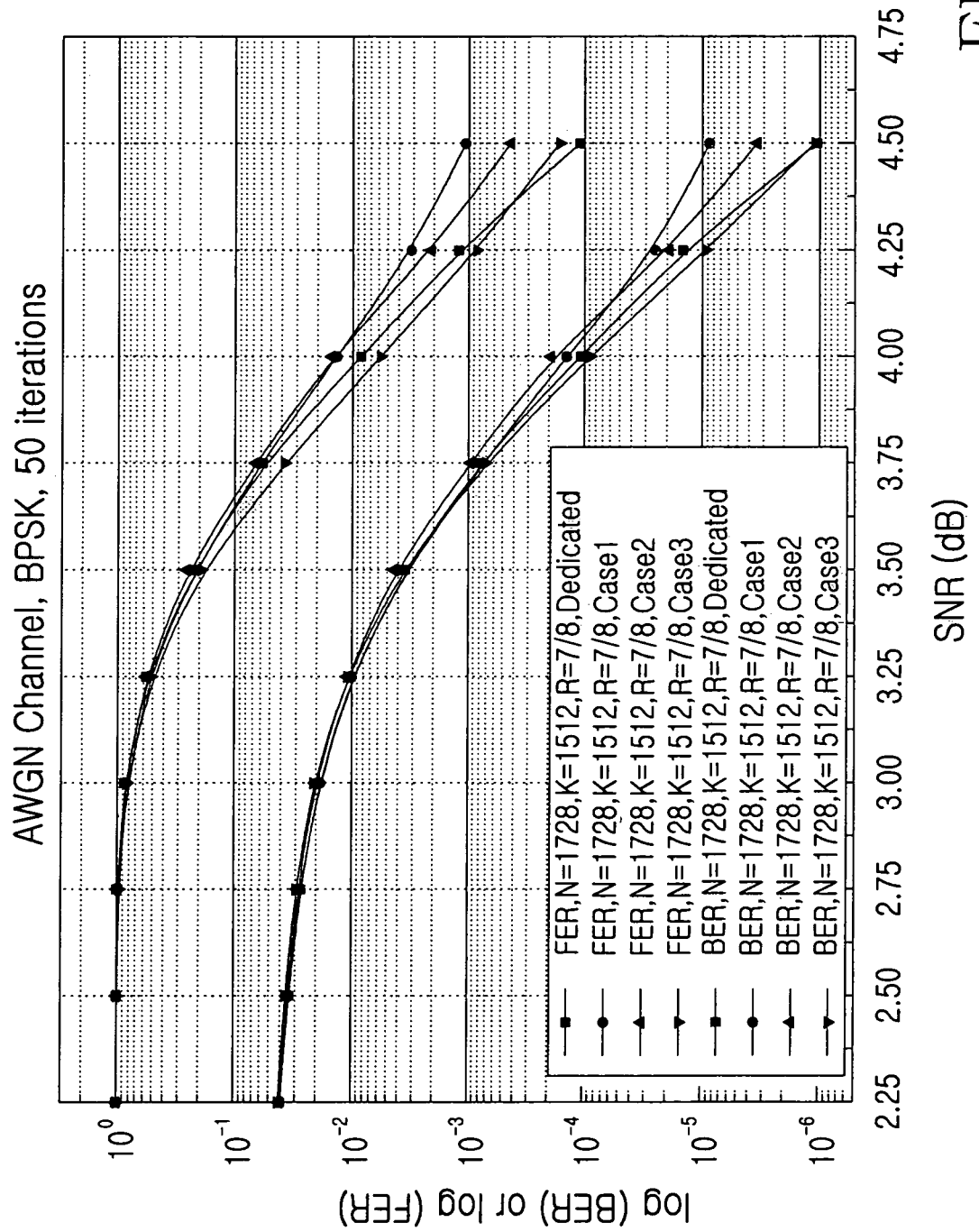
FIG. 10 is a graph illustrating a performance comparison between a novel puncturing pattern and the conventional puncturing pattern when a BLDPC mother code with N=2016, K=1512 and R=3/4 is subject to 228-bit (approximately 6.857-block) puncturing, providing a coding rate 7/8.

FIG. 10 is a graph illustrating a comparison in performance between the novel puncturing pattern and the conventional puncturing pattern when a BLDPC mother code with N=2016, K=1512 and R=3/4 is subject to 228-bit (approximately 6.857-block) puncturing, providing a coding rate 7/8. Compared with even the use of the optimal LDPC code, the use of the novel puncturing pattern exhibits performance gains of 0.03 dB and 0.05 dB at a BER of $10^{-4}$ and a BER of $10^{-5}$, respectively, and exhibits performance gains of 0.07 and 0.03 at an FER of $10^{-2}$ and an FER of $10^{-3}$, respectively.

As described above, by designing and applying an improved puncturing pattern according to the present invention for a zigzag parity part (dual-diagonal with single 3-weight column) that can be subject to linear space-time coding with a coding complexity of O (N), it is possible to minimize a performance loss caused by the puncturing.

In addition, the puncturing pattern design method according to the present invention can improve reliability of a puncturing operation by defining a factor that serves as a criterion for selecting punctured nodes.

Further, the puncturing pattern design method according to the present invention can improve reliability of punctured nodes and minimize a performance loss caused by the puncturing by introducing the quality concept in defining a k-SR node.

Moreover, the puncturing pattern design method according to the present invention can be applied as a puncturing technique for a zigzag parity pattern that has been recently adopted in 802.16e as an option and proposed by a working group of 802.11n.

Preferably, the puncturing pattern is set such that if the columns constituting the parity part include columns having the same weight, the bits of the LDPC code are punctured in an order of a bit mapped to a column with a higher priority.

Preferably, the priority represents the number of survived check nodes connected to a bit node punctured in a current iterative decoding process.

Preferably, the survived check node includes a check node connected to all non-punctured bit nodes except for a bit node punctured in the current iterative decoding process, or exclusively to bit nodes recovered in a previous iterative decoding process, among check nodes connected to the punctured bit node. Preferably, the puncturing pattern is set such that the number of punctured bit nodes that can be recovered through an iterative decoding process immediately after a bit mapped to a column with the highest column weight is punctured, is maximized.

Preferably, the puncturing pattern is set such that the number of survived check nodes connected to punctured bit nodes that can be recovered through a first iterative decoding process is maximized.

Preferably, the survived check node includes a check node connected to all non-punctured bit nodes except for a bit node punctured in the current iterative decoding process, or exclusively to bit nodes recovered in a previous iterative decoding process, among check nodes connected to the punctured bit node. The bit node mapped to the column with the highest weight, determining at least one bit node that can be recovered in the next iterative decoding process, using the factor graph; and puncturing the LDPC code in order of a bit node with the highest priority among the determined recoverable bit nodes.

Preferably, the priority represents the number of survived check nodes connected to a bit node punctured in the factor graph. Preferably, the survived check node includes a check node connected to all non-punctured bit nodes except for a punctured bit node, or exclusively to bit nodes recovered in a previous iterative decoding process, among check nodes connected to the punctured bit node.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for puncturing, by a transmitter, a low density parity check (LDPC) code by using a parity check matrix that is expressed by a factor graph including check nodes and bit nodes, being connected to each other at an edge, wherein the parity check matrix includes a parity part having a dual diagonal matrix with a single 3-weight column and the remaining columns being 2-weight columns in a mobile communication system, the method comprising:
   generating, by the transmitter, a puncturing pattern such that bits nodes of the LDPC code are punctured in order including a bit node mapped to the column with the highest weight among the columns constituting the parity part; and
   puncturing, by the transmitter, the bit nodes of the LDPC code according to the generated puncturing pattern.

2. The method of claim 1, wherein the puncturing pattern is set such that if the columns constituting the parity pan include columns having the same weight, the bits nodes of the LDPC code are punctured in order of priorities of the bit nodes mapped to the column having the same weight.

3. The method of claim 2, wherein the priority represents the number of survived check nodes connected to a bit node punctured in a current iterative decoding process.

4. The method of claim 3, wherein the survived check node includes a check node connected to all non-punctured bit nodes except for a bit node punctured in the current iterative decoding process, or exclusively to bit nodes recovered in a previous iterative decoding process, among check nodes connected to the punctured bit node.

5. The method of claim 1, wherein the puncturing pattern is set such that the number of punctured bit nodes is recovered through an iterative decoding process immediately after a bit mapped to a column with the highest column weight is punctured, is maximized.

6. The method of claim 5, wherein the puncturing pattern is set such that the number of survived check nodes connected to punctured bit nodes that is recovered through a first iterative decoding process is maximized.

7. The method of claim 6, wherein the survived check node includes a check node connected to all non-punctured bit nodes except for a bit node punctured in the current iterative decoding process, or exclusively to bit nodes recovered in a previous iterative decoding process, among check nodes connected to the punctured bit node.

8. A method for puncturing, by a transmitter, a low density parity check (LDPC) code by using a parity check matrix that is expressed by a factor graph including check nodes and bit nodes being connected to each other at an edge, wherein the parity check matrix includes a parity pan having a dual diagonal matrix with a single 3-weight column and 2-weight columns, in a mobile communication system, the method comprising:
   puncturing, by the transmitter, a bit node of the LDPC code, being mapped to a column with the highest weight among the columns constituting the parity part;
   after puncturing, by the transmitter, the bit node mapped to the column with the highest weight, determining at least one bit node that is recovered in the next iterative decoding process, using the factor graph; and
   puncturing, by the transmitter, the LDPC code in order of a bit node with the highest priority among the determined recoverable bit nodes.

9. The method of claim 8, wherein the priority represents the number of survived check nodes connected to a bit node punctured in the factor graph.

10. The method of claim 9, wherein the survived check node includes a check node connected to all non-punctured bit nodes except for a punctured bit node, or exclusively to bit nodes recovered in a previous iterative decoding process, among check nodes connected to the punctured bit node.

* * * * *